United States Patent
Kaushal et al.

(10) Patent No.: US 6,789,498 B2
(45) Date of Patent: Sep. 14, 2004

(54) ELEMENTS HAVING EROSION RESISTANCE

(75) Inventors: Tony S. Kaushal, Cupertino, CA (US); Chuong Quang Dam, San Jose, CA (US); Daniel Ashkin, Carlsbad, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/085,670

(22) Filed: Feb. 27, 2002

(65) Prior Publication Data

US 2003/0159657 A1 Aug. 28, 2003

(51) Int. Cl.[7] .............................. C23C 6/00; C23F 1/00; H01L 21/00
(52) U.S. Cl. ................ 118/723 R; 118/715; 156/345.1; 204/298.01
(58) Field of Search .................... 118/723 R; 156/345.35

(56) References Cited

U.S. PATENT DOCUMENTS

| | | | |
|---|---|---|---|
| 4,098,612 A | 7/1978 | Rhodes et al. | 106/73.2 |
| 4,166,831 A | 9/1979 | Rhodes et al. | 264/1 |
| 4,552,851 A | 11/1985 | Hsieh | 501/98 |
| 5,164,348 A | 11/1992 | Wood | 501/127 |
| 5,312,789 A | 5/1994 | Wood | 501/127 |
| 5,680,013 A | 10/1997 | Dornfest et al. | 315/111.21 |
| 5,846,505 A | 12/1998 | Saegusa | 423/263 |
| 5,902,763 A | 5/1999 | Waku et al. | 501/127 |
| 6,087,014 A | 7/2000 | Dombrowski | 428/432 |
| 6,123,791 A | 9/2000 | Han et al. | 156/1 |
| 6,352,611 B1 | 3/2002 | Han et al. | 156/345 |
| 2003/0049499 A1 * | 3/2003 | Murakawa et al. | 428/697 |
| 2003/0064225 A1 * | 4/2003 | Ohashi et al. | 428/408 |
| 2003/0130106 A1 * | 7/2003 | Yoshikawa et al. | 501/98.4 |

FOREIGN PATENT DOCUMENTS

JP          09087012 A  *  3/1997  ........... C04B/35/18

* cited by examiner

*Primary Examiner*—Parviz Hassanzadeh
*Assistant Examiner*—Karla Moore
(74) *Attorney, Agent, or Firm*—Robert M. Wallace

(57) ABSTRACT

A component of a plasma reactor chamber for processing a semiconductor workpiece, the component being a monolithic ceramic piece formed from a mixture of yttrium aluminum perovskite (YAP) and yttrium aluminum garnet (YAG) formed from a mixture of yttria and alumina powders, the ratio the powders in said mixture being within a range between one ratio at which at least nearly pure yttrium aluminum perovskite is formed and another ratio at which at least nearly pure yttrium aluminum garnet is formed.

19 Claims, 2 Drawing Sheets

ELEMENTS HAVING EROSION RESISTANCE

BACKGROUND OF THE INVENTION

Plasma reactors for processing silicon wafers in the manufacture of microelectronic integrated circuits typically employ materials or process gases such as fluorine or chlorine at some point during their operation. Likewise, materials or process gases such as fluorine or chlorine are used to periodically clean reactor chamber surfaces in non-etch applications as well. For example, a plasma reactor for etching either silicon or silicon dioxide thin films typically employs a fluorine-containing process gas during etch processing. As another example, a plasma reactor for chemical vapor deposition employs fluorine-containing gases during chamber cleaning operations. The problem is that fluorine is a highly efficient etch species and tends to etch not only the intended material, e.g., a thin film on the wafer or contamination on chamber walls, but also the chamber walls themselves, as well as other components of the chamber, such as replaceable process kits, shadow rings and so forth. Chamber walls and the various permanent and semi-permanent or replaceable components within the chamber are typically formed of materials that have certain desirable characteristics, such as their ability to act as an electrical insulator while withstanding heat and corrosion from the plasma. Such insulative chamber component materials must be strong and have a fairly high fracture toughness so that they can be machined without cracking, chipping, or other damage. For example, insulative chamber walls and chamber components used in etch processes are typically formed of dielectric materials or ceramics such as alumina, aluminum nitride, silicon nitride and the like. These materials have a fracture toughness of at least about 2 megaPascals-$m^{1/2}$ or more, and therefore readily satisfy the requirement of machinability. Fracture toughness of a material is the measure of force required to lengthen a crack through the material by a given distance.

Since the materials used for internal chamber components are susceptible to corrosion and wear by fluorine-containing process gases and plasmas, the components must be periodically replaced, involving significant costs in manufacture as well as loss of use of the reactor during parts removal and replacement. Therefore, the industry has sought for a solution that would reduce or eliminate the need to replace such parts. To this end, various attempts have been made to find suitable protective coatings to deposit on the surfaces of chamber walls and chamber components to protect them from erosion, corrosion, wear and deterioration. Such protective coatings must be of materials that are less susceptible to attack by materials such as fluorine or chlorine, for example. The chamber components could be machined prior to deposition of the protective coating, so that the coating material itself would not need to be machinable, and therefore could have a relatively low fracture toughness. The main requirement for the coating, therefore, would be only that it resist or be impervious to corrosion by fluorine-containing gases. In fact, coating materials that have been tried thus far, such as, for example, yttrium oxide and yttrium aluminum garnet, have good resistance to fluorine while having poor fracture toughness. However, the low fracture toughness is not particularly relevant provided the coating is applied to parts that have already been machined.

Because of the poor fracture toughness of such fluorine-resistant materials, it has not been practical to form monolithic chamber components (e.g., chamber walls, process kits, focus rings, etc.) from such ceramic materials in their pure composition. For example, attempts to form a typical process kit dielectric ring from pure solid yttria fail because the yttria fractures during machining or milling. This difficulty occurs for a wide variety of yttrium aluminates, and is due in part to the nature of the yttria and alumina powders used to form such compounds. To form a yttrium aluminate ceramic, yttria and alumina powders are mixed in a desired proportion with a binder, such as water or alcohol, and pressed together in a mold to form the desired shape, the resulting component being referred to in the industry as a "green" part. The green part is then subjected to high temperature and at the same time, in some instances, high chamber pressure. This last step results in the green part becoming a hard ceramic part. The poor fracture toughness encountered with such ceramic parts is due in part to a low packing density of the green part formed by pressing the alumina and yttria powders. The hard ceramic is then machined, such as by cutting, grinding, drilling, milling, etc., to finished dimensions.

Ceramics made from mixtures of yttria and alumina powders form different ceramic compounds for different proportions of yttria and alumina in the mix. For example, a mixture of about 50% yttria and 50% alumina by mole percentage results, after sintering, in formation of ceramic yttrium aluminum perovskite. A mixture of about 38% yttria and 62% alumina results in ceramic yttrium aluminum garnet. Of course, pressing and sintering pure yttria powder results in ceramic yttria. We have confirmed the low fracture toughness of each of the foregoing ceramic compounds. Specifically, ceramic yttrium aluminum garnet has a fracture toughness of 1.7 megaPascal-$m^{1/2}$ before heating treating and 2.0 megaPascal-$m^{1/2}$ after heat treating, both values of which are insufficient for machinability. Ceramic yttria has a fracture toughness of 1.7 megaPasacal-$m^{1/2}$ after heat treating. Ceramic yttrium aluminum perovskite is so weak that we would not measure its fracture toughness. We feel that a fracture toughness of at least 2.5 megaPascal-$m^{1/2}$ is necessary for machinability. Thus, none of the foregoing compounds are machinable. These compounds span a wide range of mixtures of yttria and alumina powders, and therefore it would seem unlikely that some mixture thereof exists that could yield a sufficient fracture toughness for machinability.

One solution to the poor fracture toughness of such materials is to introduce another material, such as a silicon-containing species, into the yttria-alumina powder mix prior to pressure molding and heat treatment. The resulting ceramic material in some cases has a sufficiently high fracture toughness (e.g., 2 megaPascal-$m^{1/2}$ to be machinable. Unfortunately, the added material is not as immune to attack by fluorine gas as is the basic yttrium-alumina compound. Accordingly, a chamber component monolithically formed of such a ceramic material (i.e., a yttrium aluminate ceramic containing an additive such as silicon), when introduced into a plasma reactor environment such as a fluorine-rich environment or a chlorine-rich, for example, is attacked by the fluorine or chlorine, and is thus hardly an improvement over conventional ceramic materials (e.g., silicon-nitride and aluminum nitride) currently used for chamber components and walls.

As a result, it has seemed impossible to produce a monolithic yttrium aluminate ceramic chamber component, such as a process kit or a ring, that can be machined to the required shape and size while being corrosion resistant in a fluorine-rich or chlorine-rich or other corrosive species-rich environment.

SUMMARY OF THE INVENTION

A component of a plasma reactor chamber for processing a semiconductor workpiece, the component being a monolithic ceramic piece formed from a mixture of yttrium aluminum perovskite (YAP) and yttrium aluminum garnet (YAG) formed from a mixture of yttria and alumina powders, the ratio the powders in said mixture being within a range between one ratio at which at least nearly pure yttrium aluminum perovskite is formed and another ratio at which at least nearly pure yttrium aluminum garnet is formed.

In accordance with one aspect, a monolithic ceramic component of a plasma reactor chamber for processing a semiconductor workpiece is produced by a process of forming a mixture of a yttria powder and an alumina powder in a ratio of yttria to alumina powders lying within a range between 50%–50% and 62%–48% mole percentage, pressing the mixture together in a mold to form a green body thereof and then heat treating the green body to form a hardened ceramic comprising a mixture of yttrium aluminum perovskite (YAP) and yttrium aluminum garnet (YAG). The mixture of yttria and alumina powders can be about 57% yttria and 47% alumina by mole percentage. The ratio of yttria and alumina powders in said mixture can be such that the hardened ceramic has a fracture toughness sufficient to be machinable. The fracture toughness can exceed 2.0 megaPascal-$m^{1/}$ and can be about 3.6 megaPascal-$m^{1/2}$. The mixture of the powders can be such that after the heat treating, the hardened ceramic is a ratio of YAP to YAG material such that the monolithic ceramic piece has a fracture toughness of at least 2 megaPascal-$m^{1/2}$. In one regime, the ratio of YAP to YAG is in a range between about 65%–35% and 55%–45% of YAP to YAG, respectively. In another regime, the ratio of YAP to YAG is in a range between about 70%–30% and 50%–50% of YAP to YAG, respectively. Such ratios are generally in mole percentages. For example, the ratio of YAP to YAG is approximately 60%–40% of YAP to YAG in mole percentages. The ratio can be such that the fracture toughness exceeds about 2.5 megaPascal-$m^{1/2}$. Or, the ratio can be such that the fracture toughness exceeds about 3.0 megaPascal-$m^{1/2}$. Specifically, the ratio is such that the fracture toughness is about 3.6 megaPascal-$m^{1/2}$.

DETAILED DESCRIPTION

We have discovered that, although neither yttrium aluminum perovskite (YAP) nor yttrium aluminum garnet (YAG) has the requisite fracture toughness as a monolithic ceramic, a monolithic ceramic having both YAG grains and YAP grains in an optimum proportion does indeed have sufficient fracture toughness (well in excess of 2.5 megaPascal-$m^{1/2}$) to be machined. Our discovery is that the two types of grains in such a mixed ceramic (i.e., the YAG grains and the YAP grains) respond to propagating cracks in the ceramic in different ways that complement one another so as to enhance fracture toughness, in some cases to as high as 3.6 megaPascal-$m^{1/2}$, an unexpected and surprising result.

Specifically, we have discovered that for a particular proportion of YAG and YAP in a monolithic ceramic, cracks in the monolithic ceramic propagate in transgranular fashion (i.e., through the grain) at each YAG grain and propagate in intergranular fashion (i.e., around the grain boundary) at each YAP grain. As a result, the two different types of grains in the monolithic ceramic (the YAP grains and the YAG grains) exhibit complementary types of reactions to stress that produce a higher resistance to propagation of cracks than either material by itself can exhibit.

Figure 1:
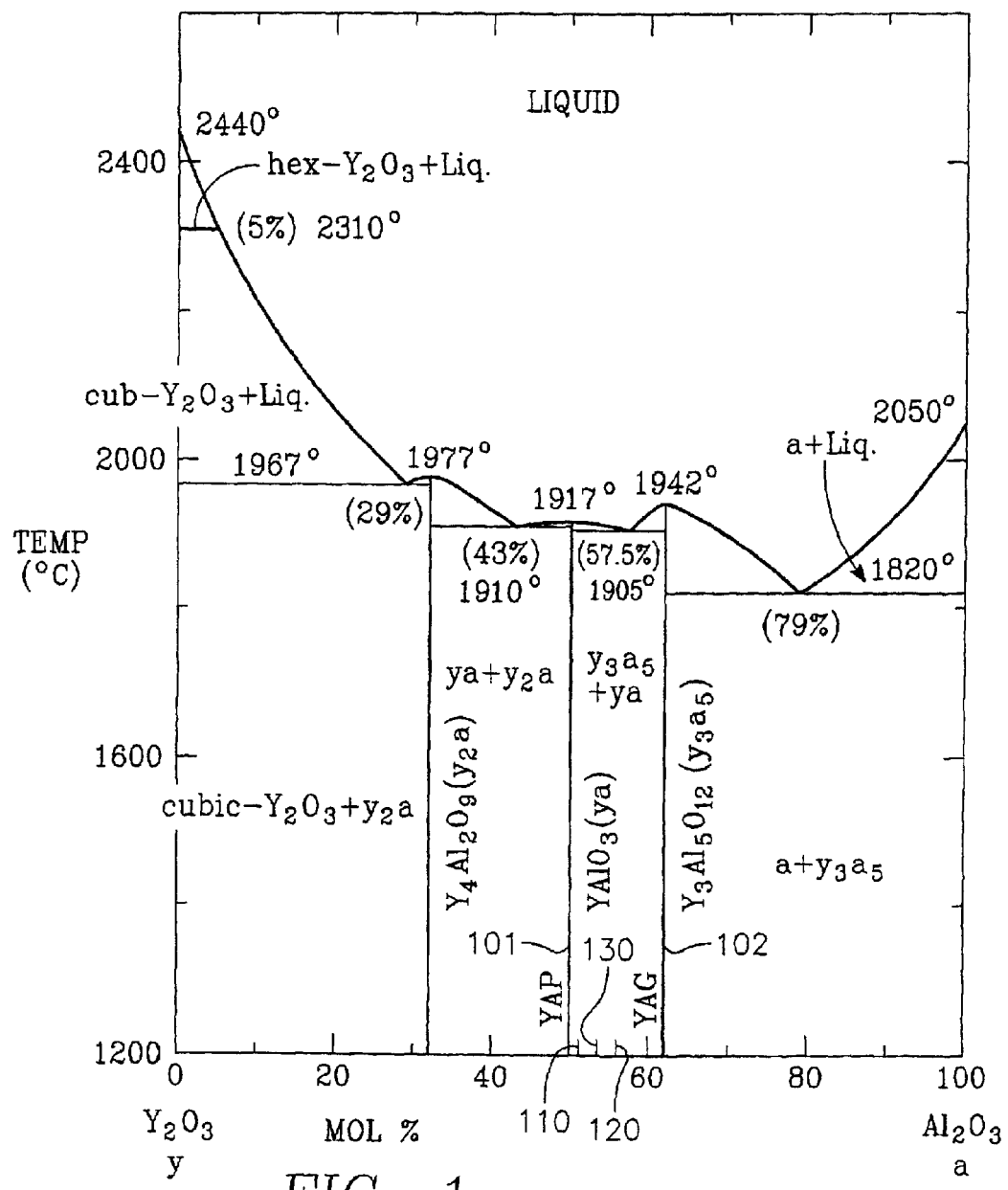
FIG. 1 is a phase diagram of yttria and alumina, and indicates the mixture proportions of the material of the invention.

FIG. 1 depicts the phase diagram of a yttria-alumina two-component system. The vertical axis is temperature in Celsius while the horizontal axis corresponds to mixture proportions in mole percentages of alumina and yttria. The left hand end of the horizontal axis corresponds to 100% yttria while the right hand end of the horizontal axis corresponds to 100% alumina, and midway between the two ends corresponds to 50% yttria and 50% alumina. The curve is the phase transition temperature. In the diagram, a short-hand notation is employed, in which the lower-case symbol "y" stands for yttria ($Y_2O_3$) and the lower case symbol "a" stands for alumina ($Al_2O_3$). The phase diagram of FIG. 1 indicates the different regions in which different yttrium aluminate compounds are formed and in some cases indicates the type of crystal structure (cubic or hexagonal) of the compound. The horizontal intercept of the phase transition temperature curve with the boundary of each region is noted in parenthesis, giving the mole percentage of alumina along with the temperature at the intercept. The phase diagram of FIG. 1 indicates the formation of pure yttrium aluminum perovskite (YAP) at a 50%–50% mixture of yttria and alumina (corresponding to point 101 on the horizontal axis), and the formation of pure yttrium aluminum garnet (YAG) at a 38%–62% mixture of yttria and alumina (corresponding to point 102 on the horizontal axis). Within certain regions of the phase diagram, the presence of two different compounds is noted in FIG. 1 by the use of the + symbol. Thus, for example, in the region formed between the point of formation of pure YAP (i.e., at the 50% point on the horizontal axis or point "101") and the point of formation of pure YAG (i.e., at the 62% point on the horizontal axis or point "102"), both compounds are present, as indicated by the notation "$y_3a_5$+ya" inside the region. Therefore, within this region, some grains in the ceramic are YAP grains while the remaining ones are YAG grains. The mole percentage of the two types of two types of grains is determined by the location along the horizontal axis. For example, half-way between the vertical boundaries 101, 102 of this region (i.e., midway between the 50% and 62% points on the horizontal axis of FIG. 1), there are an equal number of YAG and YAP grains in the ceramic.

Our discovery at least in part is that it is within this latter region (i.e., the region bounded between the pure YAG and YAP phases in FIG. 1) that a composition exists from which solid chamber components can be machined that are as impervious to fluorine corrosion as is yttria. However, most of the compounds within this region fail to meet this criteria, and therefore the discovery was improbable. For example, a monolithic structure that we formed consisting of 20% YAP and 80% YAG (corresponding to the point on the horizontal axis labeled 110 in FIG. 1) had a fracture toughness of only 1.9 megaPascal-$m^{1/2}$, below the level required for machinability (at least 2.5 megaPascal-$m^{1/2}$). A monolithic structure that we formed consisting of 80% YAP and 20% YAG (corresponding to the point 120 on the horizontal axis of FIG. 1) had such a low fracture toughness that it was not measurable (because the material formed irregular cracks). Such results would seem to indicate it was unlikely to find a mixture of YAG and YAP that was machinable.

Nevertheless, we did succeed in discovering a mixture of YAG and YAP lying within a narrower range lying between the two points 110, 120 on the horizontal axis of FIG. 1. The mixture we have discovered forms a monolithic ceramic which is highly machinable. Specifically, we discovered that a monolithic structure formed of 60% YAP and 40% YAG (corresponding to the point 130 on the horizontal axis of FIG. 1) has a surprisingly high fracture toughness of 3.2 megaPascal-m$^{1/2}$ prior to heat treatment (well in excess of the required fracture toughness for machinability) and a remarkably high 3.6 megaPascal-m$^{1/2}$ after heat treatment. The monolithic piece was as resistant to fluorine corrosion as yttria, and yet has the fracture toughness required to be machinable. As mentioned above, the presence in the ceramic of both types of grains (YAP and YAG grains) enhances the fracture toughness of the material beyond that which is obtained in ceramics formed of either one of the two materials alone. It is believed this is because each type of grain reacts to stress in a different way that complements the other. Specifically, cracks propagate transgranularly across YAG grains and intragranularly within YAP grains, as described previously herein.

Figure 2:
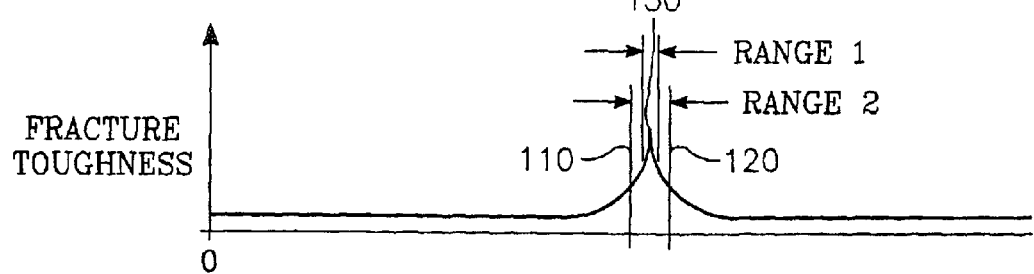
FIG. 2 is a graph illustrating the fracture toughness of the material of the invention as a function of composition.

Because a monolithic ceramic component formed of 60% YAP and 40% YAG has a fracture toughness almost 50% greater than that required for machinability, departures from this exact 60%–40% mixture ratio that reduce the fracture toughness are acceptable, provided the resulting fracture toughness does not fall below about 2.0–2.5 megaPascal-m$^{1/2}$. For example, we have already found (as described above) that a departure from the optimum 60%–40% ratio to an 80%–20% ratio results in a fracture toughness below the minimum required for machining. Therefore, acceptable departures must be smaller, on the order of 10% in either direction. Thus, we expect that a YAP-YAG mixture ratio between 70%–30% and 50%–50% would have a minimum fracture toughness of at least 2.0–2.5 megaPascal-m$^{1/2}$. A narrower range of YAP-YAG mixture ratios, i.e., a range from 65%–35% to 55%–45%, would guarantee an even higher minimum fracture toughness across the entire range. This concept is illustrated in the graph of FIG. 2, in which the horizontal axis of FIG. 2 corresponds to the portion of the horizontal axis of FIG. 1 lying between the two points 110 and 120 and defining the phase or region within which different mixtures of YAP and YAG occur. The vertical axis is fracture toughness. The curve of FIG. 2 peaks at point 130 on the horizontal axis, corresponding to the optimum 60%–40% YAP-YAG mixture that we have discovered. The curve falls off monotonically from this maximum in either direction. The range labeled "range 2" in FIG. 2 corresponds to the wider YAP-YAG mixture range of 70%–30% to 50%–50%, and has a minimum fracture toughness of about 2 megaPascal-m$^{1/2}$ at either end of the range. The range labeled "range 1" in FIG. 2 corresponds to the narrower range of YAP-YAG mixture ratios of 65%–35% to 55%–45%, and has a minimum fracture toughness of about 2.5 megaPascal-m$^{1/2}$ at either end of the latter range.

The concept illustrated in FIG. 2 is that a YAP-YAG ceramic can be used to form monolithic chamber components such as rings, process kits, chamber walls and the like provided the YAP-YAG mixture ratio is within a range in which the minimum fracture toughness does not fall below the level required for machinability. Typically, this level is 2.0 to 2.5 megaPascal-m$^{1/2}$. Of course, the lower the minimum required fracture toughness, the broader the admissible mixture range.

Figure 3:
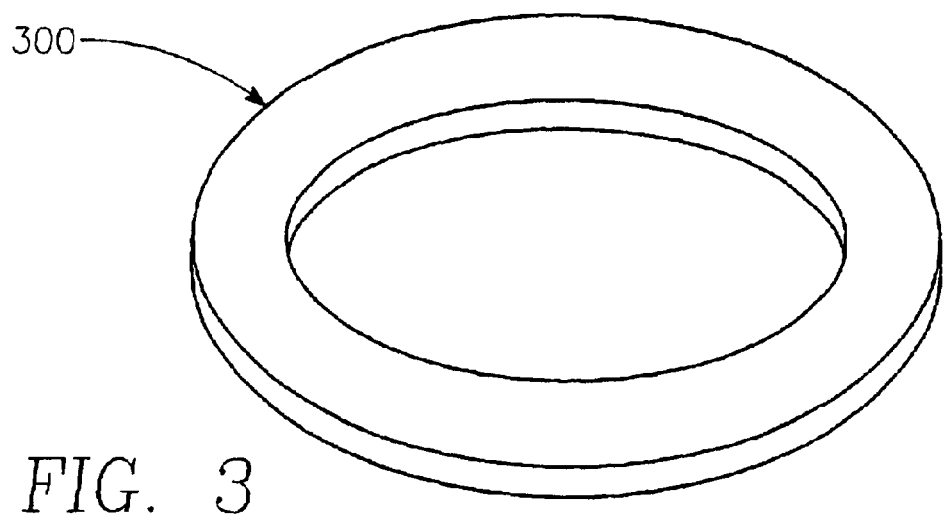
FIG. 3 illustrates a ring or collar formed of monolithic ceramic in accordance with the invention.
Figure 4:
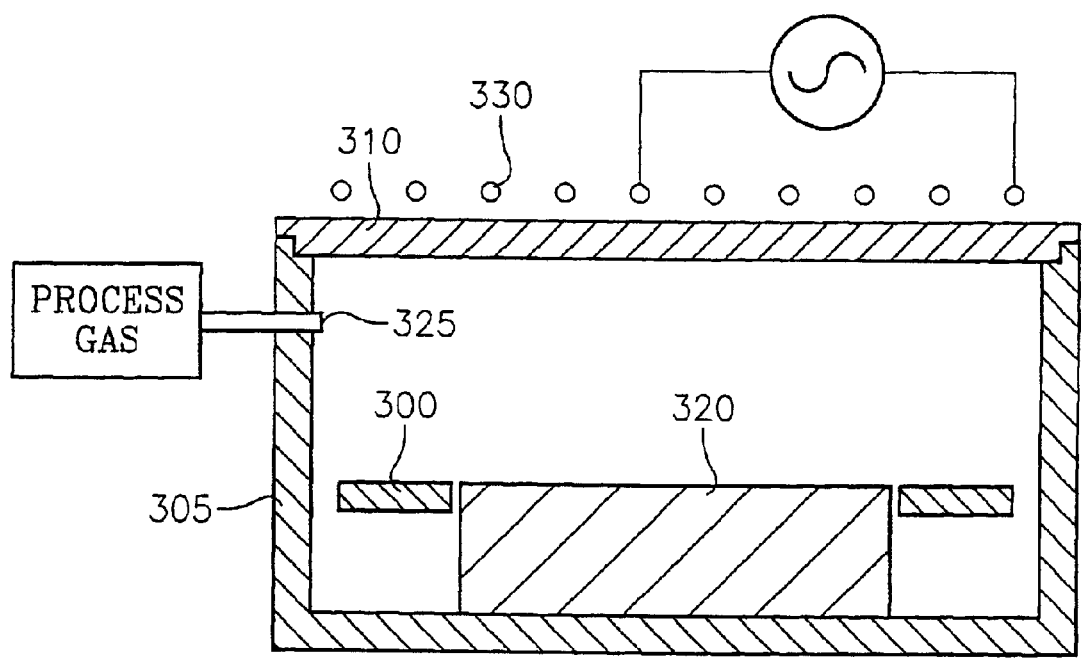
FIG. 4 illustrates a plasma reactor having certain chamber components formed of the material of the invention.

FIG. 3 illustrates a process kit ring 300 for a plasma reactor that we made as a monolithic ceramic of 60% YAP and 40% YAG. The process kit ring 300 is a collar surrounding a wafer support pedestal within the reactor chamber. FIG. 4 illustrates a plasma reactor having the ring of FIG. 3 and further having chamber walls 305, 310 formed of the same material. The chamber of FIG. 4 may be of the type having a wafer support pedestal 320, a gas injection port 325 and an RF power applicator 330.

The monolithic YAP-YAG ceramic plasma reactor ring 300 of FIG. 3 was formed by mixing yttria and alumina powders in the correct ratio with a small amount of binder such a polyvinyl alcohol. The ratio of the two powers corresponds to point 130 on the horizontal axis of FIG. 1 at which the YAP to YAG ratio is 60%–40% mole percentage. Close inspection of FIG. 1 shows that this corresponds to a mixture ratio of yttria powder and alumina powder of about 57%–43%. The binder and powder mix is stirred to form a slurry, and then pressed together in a mold to form a "green body" of the ring of FIG. 3. Mold temperature was about 1680 degrees C. Thereafter, the green body was heat treated in a chamber at a temperature of about 1450 degrees C. for about 14 hours, which produced the ring of FIG. 3 with a fracture toughness of about 3.6 megaPascal-m$^{1/2}$.

The resulting ceramic chamber element or structural piece has excellent resistance to erosion in a fluorine environment, particularly when compared with other materials that are currently used to form chamber components. Specifically, the monolithic YAP-YAG ceramic ring of FIG. 3 has an erosion rate of 0.28 micrometers/hour under the same fluorine plasma conditions that produce an erosion rate of 1.8 micrometers/hour in silicon carbide material. For further comparison, the same conditions produce erosion rates of 0.43, 2.4 and 12 micrometers/hour in boron carbide, polysilicon and quartz, respectively. Thus, the invention results in a fluorine erosion rate that is far lower than any other practical material.

While the invention has been described in detail with specific reference to preferred embodiments, variations and modifications thereof may be made without departing from the true spirit and scope of the invention.

What is claimed is:

1. A component of a plasma reactor chamber for processing a semiconductor workpiece, said component comprising a monolithic ceramic piece comprising a mixture of yttrium aluminum perovskite (YAP) and yttrium aluminum garnet (YAG), said mixture being in a ratio of YAP to YAG material, sufficiently close to about 60%–40% so that said monolithic ceramic piece has a fracture toughness of at least 2 megaPascal-m$^{1/2}$.

2. The component of claim 1 wherein said ratio of said mixture is in a range between about 65%–35% and 55%–45% of YAP to YAG, respectively.

3. The component of claim 1 wherein said ratio of said mixture is in a range between about 70%–30% and 50%–50% of YAP to YAG, respectively.

4. The component of claim 1 wherein said ratio is in mole percentages.

5. The component of claim 1 wherein said ratio is approximately 60%–40% of YAP to YAG in mole percentages.

6. The component of claim 1 wherein said ratio is such that said fracture toughness is about 3.6 megaPascal-m$^{1/2}$.

7. A component of a plasma reactor for processing a semiconductor workpiece, said component comprising a monolithic ceramic piece comprising a mixture of yttrium aluminum perovskite (YAP) and yttrium aluminum garnet (YAG), said mixture being in a ratio of YAP to YAG material so that said monolithic ceramic piece has a fracture toughness sufficient to be machinable, said mixture being formed from a mixture of yttria powder and an alumina powder in a ratio of yttria to alumina powders lying within a range between 50%–50% and 38%–62% mole percentage.

8. The component of claim 7 wherein said ratio of said mixture is in a range between about 65%–35% and 55%–45% of YAP to YAG, respectively.

9. The component of claim 7 wherein said ratio of said mixture is in a range between about 70%–30% and 50%–50% of YAP to YAG, respectively.

10. The component of claim 7 wherein said ratio is in mole percentages.

11. The component of claim 7 wherein said ratio is approximately 60%–40% of YAP to YAG in mole percentages.

12. The component of claim 7 wherein said ratio is such that said fracture toughness is about 3.6 megaPascal-$m^{1/2}$.

13. The component of claim 7 wherein said component comprises one of: (a) an annular ring of said plasma reactor chamber, (b) a wall of said plasma reactor chamber.

14. A component of a plasma reactor chamber for processing a semiconductor workpiece, said component being a monolithic ceramic piece constituting a mixture of yttrium aluminum perovskite (YAP) and yttrium aluminum garnet (YAG), said mixture being formed from a mixture of yttria powder and an alumina powder in a ratio of yttria to alumina powders lying within a range between 50%–50% and 38%–62% mole percentage.

15. The component of claim 14 wherein said mixture is in a ratio of YAP to YAG material sufficiently close to about 60%–40% so that said monolithic ceramic piece has a fracture toughness of at least 2 megaPascal-$m^{1/2}$.

16. A component of a plasma reactor chamber for processing a semiconductor workpiece, said component being a monolithic ceramic piece constituting a mixture of yttrium aluminum perovskite (YAP) and yttrium aluminum garnet (YAG) formed from a mixture of yttria and alumina powders, the ratio said powders in said mixture being within a range between one ratio at which at least nearly pure yttrium aluminum perovskite is formed and another ratio at which at least nearly pure yttrium aluminum garnet is formed, said ratio lying in a range between 50%–50% and 38%–621 mole percentage.

17. The component of claim 16 if wherein said component is a ceramic ring surrounding a wafer support pedestal within the chamber.

18. The component of claim 16 wherein said component is a wall of the chamber.

19. The component of claim 17 wherein said piece comprise an array of YAG grains and YAP grains in which cracks propagate transgranularly across the YAG grains and intragranularly within the YAP grains.

* * * * *